(12) United States Patent
Miyasaka et al.

(10) Patent No.: US 9,368,664 B2
(45) Date of Patent: Jun. 14, 2016

(54) BIAXIALLY STRETCHED POLYESTER FILM FOR PROTECTING BACK SURFACE OF SOLAR CELL, AND METHOD FOR PRODUCING POLYESTER RESIN

(71) Applicant: FUJIFILM Corporation, Tokyo (JP)

(72) Inventors: Rei Miyasaka, Fujinomiya (JP); Toshihiro Oda, Fujinomiya (JP); Kiyokazu Hashimoto, Fujinomiya (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 14/643,106

(22) Filed: Mar. 10, 2015

(65) Prior Publication Data

US 2015/0179851 A1 Jun. 25, 2015

Related U.S. Application Data

(63) Continuation of application No. PCT/JP2013/076179, filed on Sep. 27, 2013.

(30) Foreign Application Priority Data

Sep. 27, 2012 (JP) .................................. 2012-213623

(51) Int. Cl.
| | | |
|---|---|---|
| C08G 63/00 | (2006.01) |
| H01L 31/049 | (2014.01) |
| C08J 5/18 | (2006.01) |
| C08G 63/85 | (2006.01) |
| C08G 64/00 | (2006.01) |

(52) U.S. Cl.
CPC .............. *H01L 31/049* (2014.12); *C08G 63/85* (2013.01); *C08J 5/18* (2013.01); *C08J 2367/02* (2013.01); *Y02E 10/50* (2013.01)

(58) Field of Classification Search
CPC ................................. C08G 63/85; C08G 63/82
USPC ........................................... 528/271, 272, 279
See application file for complete search history.

(56) References Cited

U.S. PATENT DOCUMENTS

2012/0302676 A1 11/2012 Oya et al.
2013/0199599 A1* 8/2013 Fukuda ..................... C08J 5/18
                                                                    136/252

FOREIGN PATENT DOCUMENTS

| JP | 08-291216 A | 11/1996 |
| JP | 2011-243761 A | 12/2011 |
| JP | 2011-256335 A | 12/2011 |
| JP | 2011-258641 A | 12/2011 |
| JP | 2012-122000 A | 6/2012 |
| JP | 2012-136019 A | 7/2012 |
| WO | 2012/081372 A1 | 6/2012 |

OTHER PUBLICATIONS

International Preliminary Report on Patentability dated Apr. 9, 2015 from the International Bureau in counterpart PCT International Application No. PCT/JP2013/076179.
International Search Report of PCT/JP2013/076179 dated Nov. 12, 2013 [PCT/ISA/210].
Written Opinion of PCT/JP2013/076179 dated Nov. 12, 2013 [PCT/ISA/237].
Office Action dated Sep. 29, 2015 from the Japanese Patent Office in counterpart Japanese Application No. 2013-201333.
Office Action dated Dec. 22, 2015, issued by the Japan Patent Office in corresponding Japanese Application No. 2013-201333.

* cited by examiner

*Primary Examiner* — Terressa Boykin
(74) *Attorney, Agent, or Firm* — Sughrue Mion, PLLC

(57) ABSTRACT

A biaxially stretched polyester film for protecting a back surface of a solar cell, containing a polyester resin that is polymerized with addition of a Ti catalyst, a Mg compound, a P compound and a nitrogen-containing heterocyclic compound, and having a volume resistivity at 285° C. is $10 \times 10^7$ Ω·cm or less, is improved in hydrolysis resistance and electrostatic adhesion property.

7 Claims, No Drawings

BIAXIALLY STRETCHED POLYESTER FILM FOR PROTECTING BACK SURFACE OF SOLAR CELL, AND METHOD FOR PRODUCING POLYESTER RESIN

CROSS-REFERENCE TO RELATED APPLICATIONS

This application is a Continuation of PCT International Application No. PCT/JP2013/076179, filed on Sep. 27, 2013, which claims priority under 35 U.S.C. Section 119 (a) to Japanese Patent Application No. 2012-213623 filed on Sep. 27, 2012. Each of the above applications is hereby expressly incorporated by reference, in its entirety, into the present application.

BACKGROUND OF THE INVENTION

1. Field of the Invention

The present invention relates to a biaxially stretched polyester film for protecting a back surface of a solar cell, and a method for producing a polyester resin. More specifically, the invention relates to a biaxially stretched polyester film for protecting a back surface of a solar cell, the polyester film being improved in hydrolysis resistance and electrostatic adhesion property, and a method for producing a polyester resin.

2. Background Art

A polyethylene terephthalate resin is used as a material of a back surface sealing film of a solar cell, which is one of constitutional members of a solar cell. A solar cell is used outdoors, and thus a back surface sealing film of a solar cell is strongly demanded to have resistance to the natural environments (i.e., hydrolysis resistance).

Separately, associated with the demand of increasing the film forming speed in recent years, there is a demand of a polyethylene terephthalate resin having a low volume resistivity that is produced by an electrostatic film casting method, which has been ordinarily used, for further enhancing the film forming speed.

For addressing the demands, techniques for achieving the high-speed film formation and the hydrolysis resistance simultaneously have been proposed by determining the kinds and the mixing ratios of the catalyst and the additives to specific ranges in the melt polymerization process of a polyester resin (see, for example, PTLs 1 and 2).

CITATION LIST

Patent References

Patent Reference 1: JP-A-2010-163613
Patent Reference 2: JP-A-2011-231211
Patent Reference 3: JP-A-2010-260903
Patent Reference 4: JP-A-2011-258641
Patent Reference 5: JP-A-2011-225640

SUMMARY OF INVENTION

Patent Reference 1 describes a polyester resin containing a compound of at least one element selected from the Group 4 of the periodic table, a compound of at least one element selected from the Group 2 of the periodic table, and a phosphoric acid compound, and having a volume resistivity $\rho V$ at 285° C. that satisfies $\rho V \leq 20 \times 10^7$ $\Omega \cdot cm$, an intrinsic viscosity IV that satisfies IV>0.7 dL/g, and a terminal carboxyl group amount AV that satisfies $AV \leq 20$ eq/ton of resin, in which the contents of the compound of at least one element selected from the Group 2 of the periodic table and the phosphoric acid compound satisfy $0.2 \leq P/M \leq 0.6$ (wherein P represents the concentration of phosphorus atoms in the polyester resin (mol/ton of resin), and M represents the concentration of metal atoms selected from the Group 2 of the periodic table in the polyester resin (mol/ton of resin), by which a polyester resin is provided that is enhanced in hydrolysis resistance and is capable of producing a film with good productivity, by using a polyethylene terephthalate resin that is inexpensive and has excellent mechanical characteristics.

Patent Reference 2 describes a method for producing a polyester film by mixing a polyester resin (A) and a polyester resin (B), and molding the mixture, in which the polyester resin (A) contains titanium atoms, at least one kind of atoms selected from the Group 2 of the periodic table, and phosphorus atoms, and has a volume resistivity $\rho V$ at 285° C. of more than $50 \times 10^7$ $\Omega \cdot cm$, an intrinsic viscosity IV of 0.72 dL/g or more, and a terminal carboxyl group amount AV of 20 eq/ton or less, and the polyester resin (B) contains a compound of atoms selected from the Group 2 of the periodic table in an amount of from 50 to 300 ppm by weight in terms of atoms, by which a polyester film is produced efficiently that has good hydrolysis resistance and is suitable for a back surface sealing film of a solar cell.

Patent Reference 3 describes a biaxially oriented polyester film that satisfies: a condition (1), in which the carboxyl end group amount is 5 eq/ton or less based on the polyester, and a condition (2), in which the total metal element content is 150 ppm or less based on the polyester (wherein the total metal element content herein means the total amount of alkali metals, alkaline earth metals, transition metals except for titanium, and typical metals), by which a polyester film is provided that has long-term heat stability and extremely high hydrolysis resistance.

Patent References 4 and 5 describe use of a polyester composition containing a cyclic compound having a carbodiimide group, as a biaxially oriented polyester film for a back surface protective film of a solar cell. Patent References 4 and 5 describe that the use of the cyclic compound in a biaxially oriented polyester film imparts high hydrolysis resistance thereto without deterioration of the work environment due to volatilization of an isocyanate compound.

However, as a result of production of a polyester film by the present inventors by using the polyester resins described in Patent References 1 and 3 to 5 and the production method described in Patent Reference 2, it has been found that a further improvement is required from the standpoint of simultaneous achievement of both the hydrolysis resistance and the electrostatic adhesion property. For example, it has been found that the biaxially oriented polyester films described in Patent References 4 and 5 are improved in the hydrolysis resistance due to the use of the cyclic compound having a carbodiimide group, but have an increased volume resistance deteriorating the electrostatic adhesion property, by which the film formation efficiency in an electrostatic film casting method is deteriorated.

As another technique, furthermore, Patent Reference 3 (JP-A-2010-260903), paragraph [0191], describes a technique of achieving high-speed film formation property (see, for example, Japanese Patent No. 1,908,279). The use of a cobalt compound mixed is described therein, but a cobalt compound may have an impact on the environment, and may have a problem that a cobalt compound has an ester exchange capability to cause increase of the end COOH groups due to decomposition reaction in melt polymerization, which diminishes the enhancement of the hydrolysis resistance, as compared to the case where no cobalt compound is mixed.

As described above, there has been a trade-off problem, in which the enhancement of hydrolysis resistance may deteriorate the electrostatic adhesion property, whereas the electrostatic adhesion property imparted may deteriorate the hydrolysis resistance.

An object of the invention is to provide a biaxially stretched polyester film for protecting a back surface of a solar cell that is improved in both the hydrolysis resistance and the electrostatic adhesion property, and a method for producing a polyester resin.

As a result of earnest investigations made by the inventors, it has been found that a biaxially stretched polyester film for protecting a back surface of a solar cell that is improved in both the hydrolysis resistance and the electrostatic adhesion property may be obtained by synthesizing a polyester resin with addition of a Ti catalyst, a Mg compound, a P compound and a nitrogen-containing heterocyclic compound, and controlling the volume resistivity $\rho V$ at 285° C. of the polyester resin to $10 \times 10^7$ Ω·cm or less, and thus the invention has been completed.

The invention includes the following aspects for solving the problem.

(1) A biaxially stretched polyester film for protecting a back surface of a solar cell, containing a polyester resin that is polymerized with addition of a Ti catalyst, a Mg compound, a P compound and a nitrogen-containing heterocyclic compound, and satisfying the following condition (1):

volume resistivity at 285° C. $\rho V \leq 10 \times 10^7$ Ω·cm     (1)

(2) In the biaxially stretched polyester film for protecting a back surface of a solar cell according to the item (1), the nitrogen-containing heterocyclic compound is preferably an imidazole compound.

(3) In the biaxially stretched polyester film for protecting a back surface of a solar cell according to the item (1) or (2), the polyester resin preferably satisfies the following condition (A):

(A) The P/Mg molar ratio satisfies $0.6 \leq P/Mg \leq 0.9$.

(4) In the biaxially stretched polyester film for protecting a back surface of a solar cell according to any one of the items (1) to (3), the biaxially stretched polyester film is preferably a film that is formed by extrusion-molding a polyester resin composition containing the polyester resin and a reactive terminal blocking agent.

(5) In the biaxially stretched polyester film for protecting a back surface of a solar cell according to the item (4), the reactive terminal blocking agent is a carbodiimide compound having a cyclic structure.

(6) A method for producing a polyester resin, containing in this order (i) adding a Ti catalyst to a polyester precursor containing a dicarboxylic acid component and a diol component, (ii) adding a Mg compound to the polyester precursor, and (iii) adding a P compound to the polyester precursor, and further containing adding a nitrogen-containing heterocyclic compound to the polyester precursor.

(7) In the method for producing a polyester resin according to the item (6), the Ti catalyst is preferably an organic chelate Ti complex having citric acid as a ligand.

According to the invention, such a biaxially stretched polyester film for protecting a back surface of a solar cell is provided that is improved in both the hydrolysis resistance and the electrostatic adhesion property.

DESCRIPTION OF EMBODIMENTS

The description for the constitutional components shown below may be made with reference to representative embodiments of the invention, but the invention is not limited to the embodiments. In this specification, numeric ranges expressed using "to" means a numeric range involving the numerals recited before and after "to" as the lower limit and the upper limit.

Biaxially Stretched Polyester Film for Protecting Back Surface of Solar Cell

The biaxially stretched polyester film for protecting a back surface of a solar cell according to one embodiment of the invention contains a polyester resin that is obtained by polymerizing a polyester precursor having added thereto a Ti catalyst, a Mg compound, a P compound and a nitrogen-containing heterocyclic compound, and satisfies the following condition (1):

Volume Resistivity at 285° C. $\rho V \leq 10 \times 10^7$ Ω·cm     (1)

The polyester precursor in the embodiment of the invention contains a raw material mixture containing a dicarboxylic acid and a diol before esterification reaction, and a reaction product of esterification reaction of a dicarboxylic acid and a diol.

According to the constitution, both the hydrolysis resistance and the electrostatic adhesion property may be improved even when a reactive terminal blocking agent is added.

The biaxially stretched polyester film for protecting a back surface of a solar cell according to one embodiment of the invention preferably contains a polyester resin that is polymerized with the use of a Ti catalyst, a Mg compound and a P compound, and preferably satisfies the following conditions (A') to (C) and (1) to (3):

(A') The P/Mg molar ratio satisfies $0.2 \leq P/Mg \leq 0.9$.

(B) The polyester resin is melt-polymerized after adding a heterocyclic compound containing nitrogen atoms in an amount of from 0.5 to 3.0 mol/ton.

(C) The biaxially stretched polyester film is formed by extrusion-molding a polyester resin composition containing the polyester resin having added thereto a reactive terminal blocking agent.

(1) volume resistivity of the film at 285° C. $\rho V \leq 10 \times 10^7$ Ω·cm (2) AV of the film ≤15 eq/ton (3) IV of the film >0.7 dL/g The condition (A') preferably satisfies the condition (A).

Polyester Resin

The polyester resin is obtained through polymerization reaction of a polyester precursor having added thereto a Ti catalyst, a Mg compound, a P compound and a nitrogen-containing heterocyclic compound.

In the case where the polymerization reaction is performed in multiple steps, the Ti catalyst, the Mg compound, the P compound and the nitrogen-containing heterocyclic compound may be added to the polyester precursor in the initial step or may be added to the polyester precursor in the course of the steps. The Ti catalyst, the Mg compound, the P compound and the nitrogen-containing heterocyclic compound may be added to the polyester precursor in the same step, may be added to the polyester precursor in different steps, and may be mixed in advance in the raw material mixture before the esterification reaction.

The polyester resin, the monomer components and the additives used in the polymerization reaction, and the polycondensation reaction process will be described in detail below.

Composition of Polyester

The polyester resin is produced through esterification or ester exchange and polycondensation of a dicarboxylic acid component containing an aromatic dicarboxylic acid as a major component, or an ester derivative of a dicarboxylic acid, and a diol component.

Specific examples of the aromatic dicarboxylic acid as the major component of the dicarboxylic acid component used as a raw material include terephthalic acid, phthalic acid, isophthalic acid, dibromoisophthalic acid, sodium sulfoisophthalate, phenylenedioxydicarboxylic acid, 4,4'-diphenyldicarboxylic acid, 4,4'-diphenyl ether dicarboxylic acid, 4,4'-diphenyl ketone dicarboxylic acid, 4,4'-diphenoxyethanedicarboxylic acid, 4,4'-diphenylsulfonedicarboxylic acid and 2,6-naphthalenedicarboxylic acid. The major component of the dicarboxylic acid used as a raw material means that the amount of the major component is 90% by mol or more, and preferably 95% by mol or more, of the dicarboxylic acid component used as the raw material. When the amount is outside the range, the film formed by using the polyester resin may have deteriorated heat resistance and insufficient strength.

The polyester resin may contain as a copolymerization component an alicyclic dicarboxylic acid, such as hexahydroterephthalic acid and hexahydroisophthalic acid, and an aliphatic dicarboxylic acid, such as succinic acid, glutaric acid, adipic acid, pimelic acid, suberic acid, azelaic acid, sebacic acid, undecadicarboxylic acid and dodecadicarboxylic acid.

The dicarboxylic acid is generally used in the form of a free acid, or may be used in the form of a derivative, such as an alkyl ester having from 1 to 4 carbon atoms for the alkyl moiety, a halide, and an alkali metal salt.

Examples of an aliphatic diol as a major component in the diol component used as another raw material include ethylene glycol, diethylene glycol, trimethylene glycol, tetramethylene glycol, pentamethylene glycol, hexamethylene glycol, octamethylene glycol, decamethylene glycol, neopentyl glycol, 2-ethyl-2-butyl-1,3-propanediol, polyethylene glycol and polytetramethylene ether glycol. The major component herein means that the amount of the major component is 90% by mol or more, and preferably 95% by mol or more, of the diol component used as the raw material. When the amount is outside the range, the film formed by using the polyester resin may have deteriorated heat resistance and insufficient strength.

Examples of a diol used in combination with the aliphatic diol include an alicyclic diol, such as 1,2-cyclohexanediol, 1,4-cyclohexanediol, 1,1-cyclohexanedimethanol (1,1-cyclohexanedimethyol), 1,4-cyclohexanedimethanol (which may be referred herein to as CHDM and may be expressed as 1,4-cyclohexanedimethylol) and 2,5-norbornanedimethyol, an aromatic diol, such as xylylene glycol, 4, 4'-dihydroxybiphenyl, 2,2-bis(4'-hydroxyphenyl)propane, 2,2-bis(4'-β-hydroxyethoxyphenyl)propane, bis(4-hydroxyphenyl)sulfone and bis(4-β-hydroxyethoxyphenyl)sulfonic acid. Among these, an aromatic diol component may be used after adding an alkylene oxide. Examples thereof include an ethylene oxide adduct or a propylene oxide adduct of 2,2-bis(4'-hydroxyphenyl)propane obtained by adding ethylene oxide or propylene oxide to 2,2-bis(4'-hydroxyphenyl)propane.

As a copolymerization component in addition to the diol component and the dicarboxylic acid component, a small amount of one or more kinds of a hydroxycarboxylic acid and an alkoxycarboxylic acid, a monofunctional component, a polyfunctional component including a trifunctional or higher component, and the like may be used. Examples of the hydroxycarboxylic acid and an alkoxycarboxylic acid include glycolic acid, p-hydroxybenzoic acid and p-β-hydroxyethoxybenzoic acid. Examples of the monofunctional component include stearyl alcohol, heneicosanol, octacosanol, benzyl alcohol, stearic acid, behenic acid, benzoic acid, t-butylbenzoic acid and benzoylbenzoic acid. Examples of the polyfunctional component include tricarballylic acid, trimellitic acid, trimesic acid, pyromellitic acid, naphthalenetetracarboxylic acid, gallic acid, trimethylolethane, trimethylolpropane, glycerol, pentaerythritol and a sugar ester.

The invention may be favorably applied to a polyester resin produced from a dicarboxylic acid component that contains as a major component terephthalic acid or 2,6-naphthalenedicarboxylic acid and a diol component that contains as a major component ethylene glycol or 1,4-cyclohexanedimethanol, and the advantageous effects of the invention may be further favorably exhibited for a polyester resin produced from a dicarboxylic acid component that contains as a major component terephthalic acid. The major component herein means that the amount of the major component is 80% by mol or more.

An embodiment where the polyester resin is polyethylene terephthalate is one of preferred embodiments of the invention, and in this embodiment, the amount of terephthalic acid may be 90% by mol or more, preferably 95% by mol or more, and more preferably 98.5% by mol or more, of the dicarboxylic acid component. The amount of ethylene glycol may be 90% by mol or more, preferably 95% by mol or more, more preferably 97% by mol or more, and further preferably 98% by mol or more, of the diol component.

An embodiment where the polyester resin is a CHDM polyester is one of preferred embodiments of the invention. The CHDM polyester herein means a polyester that has as a diol component a structure derived from 1,4-cyclohexanedimethanol (which may be referred herein to CHDM).

The biaxially stretched polyester film for protecting a back surface of a solar cell of the invention preferably contains at least one layer of a polyester layer that contains as a major component a polyester component that satisfies at least one of the following conditions (a) and (b):

condition (a): the polyester component is a polyester composition that contains a polyester and a terminal blocking agent in an amount of from 0.1 to 10% by mass based on the polyester, and condition (b): the polyester component is a CHDM polyester that contains a structure derived from 1,4-cyclohexanedimethanol (CHDM) in an amount of from 0.1 to 20% by mol or from 80 to 100% by mol based on a diol component.

The polyester film preferably contains as a major component a polyester component that satisfies at least one of the conditions (a) and (b).

The CHDM polyester preferably contains a structure derived from 1,4-cyclohexanedimethanol (CHDM) in an amount of from 0.1 to 20% by mol or from 80 to 100% by mol in the diol component (based on the total diol component) (i.e., the condition (b) is satisfied), more preferably from 0.5 to 16% by mol or from 83 to 98% by mol, and particularly preferably from 1 to 12% by mol or from 86 to 96% by mol.

In the case where the CHDM is contained to satisfy the condition (b), minute stretching unevenness is liable to occur in stretching. This is because a CHDM group has a rigid structure with respect to an EG group and thus is difficult to be stretched to cause unevenness in stretching. The unevenness in stretching may occur conspicuously on forming crystalline structures by stretching.

For forming the crystalline structures, the two ranges, i.e., the range where the proportion of the structure derived from CHDM is small (from 0.1 to 20% by mol) and the range where the proportion thereof is large (from 80 to 100% by mol), are preferred. This is because in the range between the aforementioned ranges, both CHDM and EG are present as a mixture to prevent the crystal from being formed.

The CHDM polyester may contain a diol component other than CHDM and EG, and representative examples thereof include an aliphatic diol, such as 1,2-propanediol, 1,3-propanediol, 1,4-butanediol, 1,2-butanediol and 1,3-butanediol, an alicyclic diol, such as spiroglycol and isosorbide, and an aromatic diol, such as bisphenol A, 1,3-benzenedimethanol, 1,4-benzenedimethanol and 9,9'-bis (4-hydroxyphenyl) fluorene, but the diol is not limited thereto.

Representative examples of a dicarboxylic acid other than TPA include an aliphatic dicarboxylic acid, such as malonic acid, succinic acid, glutaric acid, adipic acid, suberic acid, sebacic acid, dodecanedioic acid, dimer acid, eicosanedioic acid, pimelic acid, azelaic acid, methylmalonic acid and ethylmalonic acid, an alicyclic dicarboxylic acid, such as adamantanedicarboxylic acid, norbornenedicarboxylic acid, isosorbide, cyclohexanedicarboxylic acid and decalindicarboxylic acid, an aromatic dicarboxylic acid, such as isophthalic acid, phthalic acid, 1,4-naphthalenedicarboxylic acid, 1,5-naphthalenedicarboxylic acid, 2,6-naphthalenedicarboxylic acid, 1,8-naphthalenedicarboxylic acid, 4,4'-diphenyldicarboxylic acid, 4,4'-diphenyl ether dicarboxylic acid, 5-sodium sulfoisophthalate, phenylindanedicarboxylic acid, anthracenedicarboxylic acid, phenanthrenedicarboxylic acid and 9,9'-bis(4-carboxyphenyl)fluorensic acid, and ester derivatives thereof, but the dicarboxylic acid is not limited thereto. Among these, isophthalic acid (IPA) is preferred. The amount of IPA is preferably from 0 to 15% by mol, more preferably from 0 to 12% by mol, and further preferably from 0 to 9% by mol, based on the total amount of the dicarboxylic acid.

In the case where a CHDM polyester that satisfies the condition (b) is used in the invention, at least one layer containing the CHDM polyester that satisfies the condition (b) may be provided, and a single layer structure and a structure containing two or more layers may be used therefor. Specifically, an additional layer other than the layer containing the CHDM polyester that satisfies the condition (b) may be laminated.

In the case where the amount of the structure derived from CHDM is from 80 to 100% by mol, in particular, the laminated structure is preferred. This is because when the proportion of the structure derived from CHDM is increased, the proportion of the rigid CHDM group is increased to induce breakage on stretching. Accordingly, a polyester that does not have the CHDM structure and thus is liable to be stretched (i.e., is difficult to be broken) is preferably laminated, and more preferably PET is laminated.

In the polyester film of the invention, such an embodiment is also preferred that contains a layer containing a CHDM polyester that satisfies the condition (b) (which may be referred to as a P1 layer) and a layer containing as a major component polyethylene terephthalate (which may be referred to as a P2 layer) laminated on each other.

The P2 layer herein means a layer containing a terephthalic acid unit in an amount of 95% or more in the dicarboxylic acid unit and an ethylene glycol unit in an amount of 95% by mol or more in the diol unit.

The P2 layer preferably has IV of from 0.7 to 0.9, more preferably from 0.72 to 0.85, and further preferably from 0.74 to 0.82. When the P2 layer has high IV, entanglement of the molecules is facilitated to enhance the stretchability, thereby suppressing the breakage.

In the polyester film of the invention, the total number of the P1 layer and the P2 layer is 2 or more, more preferably from 2 to 5, and further preferably from 2 to 4. In particular, such a structure is preferred that the P1 layer is provided as the outermost layer of the polyester support on the side where the conductive layer is provided, and examples thereof include a three-layer structure containing the P2 layer having on both sides thereof the P1 layers, and a two-layer structure containing the P2 layer and the P1 layer laminated on each other.

In the case where the polyester film contains two or more layers, the total thickness of the 21 layer is preferably from 10 to 50%, more preferably from 15 to 45%, and further preferably from 20 to 40%, of the total thickness. When the thickness is the lower limit or more, the stretchability may be enhanced by the presence of PET, and when the thickness is the upper limit or less, the non-uniformity of the conductive layer due to the CHDM structure may be induced.

The laminated structure may be produced by an ordinary method, and may be achieved by laminating and extruding the melts (i.e., the molten materials of the resins) fed from plural extruder through a multiple manifold die or a feed block die.

The thickness of the layers of the polyester film may be obtained by measuring the cross section of the film with SIMS, and imaging the characteristic fragment of the P1 layer and the characteristic fragment of the P2 layer.

The proportion (molar ratio) of the diol to the dicarboxylic acid subjected to esterifications or ester exchange reaction in the production of the polyester resin is generally in a range of from 1.02 to 2.0, and preferably from 1.03 to 1.7.

Catalyst and Additive in Synthesis of Polyester Resin, and Additive after Synthesis of Resin The catalyst and the additive in the synthesis of the polyester resin, and the additive after the synthesis of the resin will be described. The following compounds each may be used solely or as a combination of two or more kinds thereof. The catalyst and the additive used in the synthesis of the polyester resin also preferably include, in addition to the following compounds, the catalysts and the additives described in JP-A-2011-162777 and JP-A-2012-012578, which are incorporated herein by reference.

(i) Ti Catalyst

The polyester resin is polymerized with the use of a Ti catalyst.

Examples of a compound that is used as the Ti catalyst include an organic chelate titanium complex having an organic acid as a ligand, an oxide, a hydroxide, an alkoxide, an acetate salt, a carbonate salt, an oxalate salt and a halide of titanium. Specifically, in the titanium compound, for example, examples of the organic acid contained as a ligand in the organic chelate titanium complex include citric acid, lactic acid, trimellitic acid and malic acid, and among these, an organic chelate complex having citric acid or a citrate salt as a ligand is more preferred. Examples of the titanium compound also include a titanium alkoxide, such as tetra-n-propyl titanate, tetra-i-propyl titanate, tetra-n-butyl titanate, tetra-n-butyl titanate tetramer, tetra-t-butyl titanate, tetracyclohexyl titanate, tetraphenyl titanate and tetrabenzyl titanate, a titanium oxide obtained through hydrolysis of a titanium alkoxide, a composite oxide of titanium and silicon or zirconium obtained through hydrolysis of a mixture of a titanium alkoxide and a silicon alkoxide or a zirconium alkoxide, titanium acetate, titanium oxalate, potassium titanium oxalate, sodium titanium oxalate, potassium titanate, sodium titanate, a titanic acid-aluminum hydroxide mixture, titanium chloride, a titanium chloride-aluminum chloride mixture, titanium bromide, titanium fluoride, potassium hexafluorotitanate, cobalt hexafluorotitanate, manganese hexafluorotitanate, ammonium hexafluorotitanate and titanium acetylacetonate. Among these, a titanium alkoxide, such as tetra-n-propyl titanate, tetra-i-propyl titanate and tetra-n-butyl titanate, titanium oxalate and potassium titanium oxalate are preferred, and tetra-n-butyl titanate is particularly preferred.

Among these, it is more preferred that the Ti catalyst is an organic chelate titanium complex having citric acid as a ligand.

The use of the organic chelate titanium complex having citric acid as a ligand may prevent formation of foreign matters, such as fine particles, and may provide a polyester resin that is excellent in polymerization activity and color tone, as compared to the other titanium compounds. The citric acid chelated titanium complex may be added in the step of esterification reaction, and thereby a polyester resin that is excellent in polymerization activity and color tone and has a less amount of terminal carboxyl groups may be obtained, as compared to the case where the complex is added after the esterification reaction. It may be expected that this is because the titanium catalyst also has a catalytic effect for esterification reaction, the addition thereof in the esterification step lowers the acid value of the oligomer on the completion of the esterification reaction to make the subsequent ester exchange reaction proceeding more efficiently, and a complex having citric acid as a ligand has higher hydrolysis resistance as compared to a titanium alkoxide and the like, resisting to hydrolysis in the process of esterification reaction, and thus effectively functions as a catalyst for the esterification reaction while maintaining the original activity thereof.

It has been generally known that a polyester resin may be deteriorated in hydrolysis resistance with an increased amount of terminal carboxyl groups. It is expected that the use of the aforementioned titanium compound may decrease the amount of terminal carboxyl groups to enhance the hydrolysis resistance.

The citric acid chelated titanium complex may be commercially available, for example, as Tyzor AC420, available from Dorf Ketal.

(ii) Mg Compound

The polyester resin is polymerized with the use of a Mg compound.

Examples of the Mg compound include an oxide, a hydroxide, an alkoxide, an acetate salt, a carbonate salt, an oxalate salt and a halide of magnesium. Specific examples thereof include magnesium oxide, magnesium hydroxide, a magnesium alkoxide, magnesium acetate and magnesium carbonate. Among the magnesium compounds, magnesium acetate is preferred from the standpoint of the solubility to ethylene glycol.

(iii) P Compound

The polyester resin is polymerized with the use of a P compound (phosphorus compound).

Specific examples of the phosphorus compound include a pentavalent phosphorus compound, such as orthophosphoric acid, polyphosphoric acid, and a phosphate ester, e.g., trimethyl phosphate, triethyl phosphate, tri-n-butyl phosphate, trioctyl phosphate, triphenyl phosphate, tricresyl phosphate, tris(triethylene glycol)phosphate, methyl acid phosphate, ethyl acid phosphate, isopropyl acid phosphate, butyl acid phosphate, monobutyl phosphate, dibutyl phosphate, dioctyl phosphate and triethylene glycol acid phosphate, and a trivalent phosphorus compound, such as phosphorous acid, hypophosphorous acid, and a phosphite ester, e.g., trimethyl phosphite, diethyl phosphite, triethyl phosphite, trisdodecyl phosphite, trisnonyldecyl phosphite, ethyl diethylphosphonoacetate and triphenyl phosphite, and a metal salt of lithium, sodium, potassium or the like. Among these, a phosphate ester as a pentavalent phosphorus compound is preferred, and trimethyl phosphate and ethyl acid phosphate are particularly preferred.

The polyester resin is preferably polymerized with the use of the P compound and the Mg compound while satisfying the condition (A). Specifically, the P/Mg molar ratio preferably satisfies $0.2 \leq P/Mg \leq 0.9$ (condition (A')), more preferably satisfies $0.6 \leq P/Mg \leq 0.9$ (condition (A)), and further preferably satisfies $0.6 \leq P/Mg \leq 0.8$.

(iv) Nitrogen-Containing Heterocyclic Compound

The polyester resin is polymerized with the use of a nitrogen-containing heterocyclic compound. The nitrogen-containing heterocyclic compound used is preferably imidazole or a derivative thereof, more preferably 1-methylimidazole, 1,2-dimethylimidazole, 2-methyl-1H-imidazole, 2-ethyl-4-methylimidazole or 2-undecylimidazole, and further preferably 2-ethyl-4-methylimidazole.

The amount of the nitrogen-containing heterocyclic compound added to the polyester precursor is preferably from 0.5 to 3.0 mol/ton, more preferably from 0.75 to 2.0 mol/ton, and further preferably from 1.0 to 1.5 mol/ton. The amount herein means the molar number of the nitrogen-containing heterocyclic compound added to 1 ton of the polyester resin (mol/ton).

When the amount of the nitrogen-containing heterocyclic compound added is the lower limit or more, the effect of improving the electrostatic adhesion property, the effect of decreasing the amount of terminal carboxyl groups and the effect of decreasing the amount of diethylene glycol formed as a by-product may be sufficiently obtained. When the amount of the nitrogen-containing heterocyclic compound added is the upper limit or less, the problem of causing unfavorable decomposition reaction in the polymerization reaction to deteriorate the productivity and the problem of coloration of the polyester associated thereto may be favorably suppressed.

In the case where the polycondensation reaction is performed in multiple steps, the nitrogen-containing heterocyclic compound is preferably added to the polyester precursor before the melt polymerization step.

(v) Terminal Blocking Agent

The biaxially stretched polyester film for protecting a back surface of a solar cell of the invention preferably satisfies the condition (C). Specifically, the biaxially stretched polyester film for protecting a back surface of a solar cell of the invention is preferably formed by extrusion-molding a polyester resin composition containing the polyester resin having added thereto a reactive terminal blocking agent (which may be referred herein to as a terminal blocking agent, and the terminal blocking agent referred herein means a reactive terminal blocking agent).

The amount of the reactive terminal blocking agent added is not particularly limited unless the substance of the invention is deviated, and for example, the terminal blocking agent may be preferably contained in an amount of from 0 to 10% by mass, more preferably from 0.2 to 5% by mass, and further preferably from 0.3 to 2% by mass, based on the polyester resin.

Hydrolysis of a polyester is accelerated by the catalytic action of H+ released from the terminal carboxylic acid groups and the like, and therefore the addition of a terminal blocking agent capable of being reacted with the terminal carboxylic acid groups may be effective for enhancing the hydrolysis resistance (weather resistance). Accordingly, when the amount of the terminal blocking agent is the lower limit of the aforementioned range or more, the effect of enhancing the weather resistance may be favorably exhibited. When the amount thereof is the upper limit of the range or less, the terminal blocking agent may be favorably prevented from functioning as a plasticizer of polyester to prevent the mechanical strength and the heat resistance from being deteriorated.

Examples of the terminal blocking agent include an epoxy compound, a carbodiimide compound (a carbodiimide terminal blocking agent), an oxazoline compound and a carbonate compound, and a carbodiimide is preferred due to the high affinity to PET and the high terminal blocking capability thereof.

The terminal blocking agent (particularly the carbodiimide terminal blocking agent) preferably has a large molecular weight, thereby reducing volatilization during the melt film formation. The molecular weight thereof is preferably from 200 to 100,000, more preferably from 2,000 to 80,000, and further preferably from 10,000 to 50,000. When the molecular weight of the terminal blocking agent (particularly the carbodiimide terminal blocking agent) is more than the upper limit of the aforementioned range, it may be difficult to disperse the terminal blocking agent in the polyester, thereby reducing the effect of improving the weather resistance. When the amount thereof is less than the range, the terminal blocking agent may be liable to vaporize during the extrusion and the film formation, thereby reducing the effect of improving the weather resistance.

The molecular weight of the terminal blocking agent herein means the weight average molecular weight thereof.
Carbodiimide Terminal Blocking Agent A carbodiimide compound having a carbodiimide group includes a monofunctional carbodiimide compound and a polyfunctional carbodiimide compound, and examples of the monofunctional carbodiimide compound include dicyclohexylcarbodiimide, diisopropylcarbodiimide, dimethylcarbodiimide, diisobutylcarbodiimide, dioctylcarbodiimide, t-butylisopropylcarbodiimide, diphenylcarbodiimide, di-t-butylcarbodiimide and di-β-naphthylcarbodiimide. Particularly preferred examples thereof include dicyclohexylcarbodiimide and diisopropylcarbodiimide.

The polyfunctional carbodiimide used is preferably a carbodiimide having a polymerization degree of from 3 to 15. Specific examples thereof include 1,5-naphthalenecarbodiimide, 4,4'-diphenylmethanecarbodiimide, 4,4'-diphenyldimethylmethanecarbodiimide, 1,3-phenylenecarbodiimide, 1,4-phenylenediisocyanate, 2,4-tolylenecarbodiimide, 2,6-tolylenecarbodiimide, a mixture of 2,4-tolylenecarbodiimide and 2,6-tolylenecarbodiimide, hexamethylenecarbodiimide, cyclohexane-1,4-carbodiimide, xylylenecarbodiimide, isophoronecarbodiimide, dicyclohexylmethane-4,4'-carbodiimide, methylcyclohexanedicarbodiimide, tetramethylxylylenecarbodiimide, 2,6-diisopropylphenylcarbodiimide and 1,3,5-triisopropylbenzene-2,4-carbodiimide.

A carbodiimide compound generates an isocyanate gas through thermal decomposition, and thus a carbodiimide compound having high heat resistance is preferably used. For enhancing the heat resistance, the molecular weight (polymerization degree) thereof is preferably as high as possible, and a carbodiimide compound having a terminal structure that has high heat resistance is more preferred. A carbodiimide compound is liable to be decomposed after once undergoing decomposition, and therefore such a procedure may be necessarily used that the extrusion temperature of the polyester is made lower as much as possible.

The carbodiimide as the terminal blocking agent preferably has a cyclic structure (for example, those described in JP-A-2011-153209). The compound may exhibit, irrespective of the low molecular weight thereof, the effects equivalent to the carbodiimide compound having a large molecular weight. This is because the terminal carboxylic acid group of the polyester and the cyclic carbodiimide undergo ring-opening reaction, and one of them is reacted with the polyester, whereas the other thereof having been ring-opened is reacted with another polyester to increase the molecular weight, thereby suppressing an isocyanate gas from being generated.

In the compound having a cyclic structure, the terminal blocking agent in the invention is preferably a carbodiimide compound having a carbodiimide group, the first nitrogen atom and the second nitrogen atom of which are bonded via a linking group. Furthermore, the terminal blocking agent is more preferably a carbodiimide compound having at least one carbodiimide group that is adjacent to the aromatic ring, in which the first nitrogen and the second nitrogen of the carbodiimide group adjacent to the aromatic ring are bonded via a linking group (which may be referred to as an aromatic cyclic carbodiimide).

The aromatic cyclic carbodiimide may have plural cyclic structures.

The aromatic cyclic carbodiimide is preferably an aromatic carbodiimide that does not have two or more cyclic structures formed by bonding the first nitrogen and the second nitrogen thereof via a linking group, i.e., a monocyclic compound.

The cyclic structure has one carbodiimide group (—N=C=N—) and the first nitrogen atom and the second nitrogen atom thereof are bonded via a linking group. While one cyclic structure has only one carbodiimide group, in the case where plural cyclic structures are contained in one molecule, such as a spiro ring, the compound may have plural carbodiimide groups as far as the plural cyclic structures bonded to the Spiro atom each have one carbodiimide group. The number of atoms in the cyclic structure is preferably from 8 to 50, more preferably from 10 to 30, further preferably from 10 to 20, and particularly preferably from 10 to 15.

The number of atoms in the cyclic structure referred herein means the number of atoms that directly constitute the cyclic structure, and the number is 8 for an 8-membered ring and 50 for a 50-membered ring. When the number of atoms in the cyclic structure is less than 8, the cyclic carbodiimide compound may have deteriorated stability, which may cause difficulty in storage and use in some cases. The upper limit of the number of atoms of the ring is not particularly limited from the standpoint of the reactivity, but it is difficult to synthesize a cyclic carbodiimide compound having a number of atoms of the ring exceeding 50, and there are cases where the cost is considerably increased. In view of the circumstances, the number of atoms in the cyclic structure is preferably from 10 to 30, more preferably from 10 to 20, and particularly preferably from 10 to 15.

Specific examples of the carbodiimide terminal blocking agent having the cyclic structure include the following compounds. The invention is not limited to the specific examples.

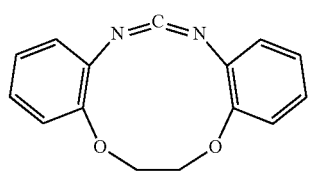

-continued

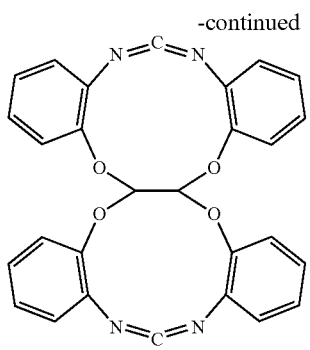

Epoxy Terminal Blocking Agent

Preferred examples of the epoxy compound include a glycidyl ester compound and a glycidyl ether compound.

Specific examples of the glycidyl ester compound include glycidyl benzoate, glycidyl t-butyl benzoate, glycidyl p-toluate, glycidyl cyclohexanecarboxylate, glycidyl pelargonate, glycidyl stearate, glycidyl laurate, glycidyl palmitate, glycidyl behenate, glycidyl versatate, glycidyl oleate, glycidyl linoleate, glycidyl linolenate, glycidyl behenolate, glycidyl stearolate, diglycidyl terephthalate, diglycidyl isophthalate, diglycidyl phthalate, diglycidyl naphthalenedicarboxylate, diglycidyl methylterephthalate, diglycidyl hexahydrophthalate, diglycidyl tetrahydrophthalate, diglycidyl cyclohexanedicarboxylate, diglycidyl adipate, diglycidyl succinate, diglycidyl sebacate, diglycidyl dodecanediolate, diglycidyl octadecanedicarboxylate, triglycidyl trimellitate and tetraglycidyl pyromellitate. These compounds may be used solely or as a combination of two or more kinds thereof.

Specific examples of the glycidyl ether compound include phenyl glycidyl ether, o-phenyl glycidyl ether, 1,4-bis(β,γ-epoxypropoxy)butane, 1,6-bis(β,γ-epoxypropoxy)hexane, 1,4-bis(β,γ-epoxypropoxy)benzene, 1-(β,γ-epoxypropoxy)-2-ethoxyethane, 1-(β,γ-epoxypropoxy)-2-benzyloxyethane, 2,2-bis[p-(β,γ-epoxypropoxy)phenyl]propane, and a bisglycidyl polyether obtainable by reaction of a bisphenol, such as 2,2-bis(4-hydroxyphenyl)propane and 2,2-bis(4-hydroxyphenyl)methane, with epichlorohydrin. These can be used solely or as a combination of two or more kinds thereof.

Oxazoline Terminal Blocking Agent

The oxazoline compound used is preferably a bisoxazoline compound, and specific examples thereof include 2,2'-bis(2-oxazoline), 2,2'-bis(4-methyl-2-oxazoline), 2,2'-bis(4,4-dimethyl-2-oxazoline), 2,2'-bis(4-ethyl-2-oxazoline), 2,2'-bis(4,4'-diethyl-2-oxazoline), 2,2'-bis(4-propyl-2-oxazoline), 2,2'-bis(4-butyl-2-oxazoline), 2,2'-bis(4-hexyl-2-oxazoline), 2,2'-bis(4-phenyl-2-oxazoline), 2,2'-bis(4-cyclohexyl-2-oxazoline), 2,2'-bis(4-benzyl-2-oxazoline), 2,2'-p-phenylenebis(2-oxazoline), 2,2'-m-phenylenebis(2-oxazoline), 2,2'-o-phenylenebis(2-oxazoline), 2,2'-p-phenylenebis(4-methyl-2-oxazoline), 2,2'-p-phenylenebis(4,4-dimethyl-2-oxazoline), 2,2'-m-phenylenebis(4-methyl-2-oxazoline), 2,2'-m-phenylenebis(4,4-dimethyl-2-oxazoline), 2,2'-ethylenebis(2-oxazoline), 2,2'-tetramethylenebis(2-oxazoline), 2,2'-hexamethylenebis(2-oxazoline), 2,2'-octamethylenebis(2-oxazoline), 2,2'-decamethylenebis(2-oxazoline), 2,2'-ethylenebis(4-methyl-2-oxazoline), 2,2'-tetramethylenebis(4,4-dimethyl-2-oxazoline), 2,2'-9,9'-diphenoxyethanebis(2-oxazoline), 2,2'-cyclohexylenebis(2-oxazoline) and 2,2'-diphenylenebis(2-oxazoline). Among these, 2,2'-bis(2-oxazoline) is most preferably used from the standpoint of the reactivity with the polyester. The bisoxazoline compounds may be used solely or as a combination of two or more thereof as far as the object of the invention is achieved.

The polyester resin may contain a component other than the aforementioned compounds, but there is no necessity of the use of a known antimony compound and a known germanium compound for making the terminal carboxyl group amount AV of the resin satisfying the condition (2).

Production Method of Polyester Resin

The polyester resin is formed through polycondensation of the dicarboxylic acid component and the diol component with addition of the additive and the like. In the polycondensation, the additives and the like are preferably added in such a manner that the conditions (A) to (C) are satisfied. The polycondensation of the dicarboxylic acid component and the diol component may be basically performed according to an ordinary production method of a polyester resin. Specifically, the production method may contain a raw material mixing step of placing the dicarboxylic acid component and the diol component in a slurry tank and mixing them under agitation to form a raw material slurry, an esterification step of performing esterification reaction under heating at normal pressure to increased pressure in an esterification reaction tank or performing ester exchange reaction in the presence of an ester exchange catalyst, so as to form an esterification product or an ester exchange product, and a polycondensation step of transporting the resulting polyester low molecular weight material to a polycondensation tank and performing melt polycondensation at reduced pressure, which is obtained by decreasing the pressure gradually from normal pressure, under heating, thereby providing a polyester resin. The polyester resin thus obtained through the polycondensation step may be used as a prepolymer and may be subjected to solid phase polycondensation to form a polyester resin, depending on necessity.

In the production method, the addition of the aforementioned compounds to the polyester precursor through the raw material mixing step, the esterification step and the polycondensation step is preferably performed according to the following method.

Specifically, the addition is preferably performed according to the method containing in this order (i) a step of adding the Ti catalyst to the polyester precursor, (ii) a step of adding the Mg compound to the polyester precursor, and (iii) a step of adding the P compound to the polyester precursor, and further containing a step of adding the nitrogen-containing heterocyclic compound to the polyester precursor.

The addition in this order may achieve both the hydrolysis resistance and the electrostatic adhesion property.

Preferred embodiments of the other conditions will be shown below.

In the case where the ester exchange reaction is performed by using an ester-forming derivative of terephthalic acid as the dicarboxylic acid component, it is generally necessary to use an ester exchange catalyst, such as a titanium compound, a magnesium compound, a calcium compound, a manganese compound and a zinc compound. The ester exchange catalyst is generally used in a relatively large amount, but the catalyst may deteriorate the property of the polyester resin in some cases, and thus in the invention, the polyester resin is preferably produced through esterification reaction by using terephthalic acid as the dicarboxylic acid component.

In the case where terephthalic acid and ethylene glycol are used as a raw material, for example, the reaction condition for the esterification reaction may be generally a temperature of approximately from 240 to 280° C., a relative pressure to the atmospheric pressure of approximately from 0 to 400 kPa, under agitation, and a reaction time of approximately from 1 to 10 hours, in the case where a sole esterification reaction tank is used. In the case where plural esterification tanks are used, the reaction in the first step esterification reaction tank is generally performed at a temperature of from 240 to 270° C., and preferably from 250 to 267° C., and a relative pressure to the atmospheric pressure thereof of from 5 to 300 kPa, and preferably from 10 to 200 kPa, and the reaction in the final step esterification tank is generally performed at a temperature of from 250 to 280° C., and preferably from 255 to 275° C., and a relative pressure to the atmospheric pressure thereof of from 0 to 150 kPa, and preferably from 0 to 130 kPa.

It has been known that in esterification reaction, the formation of diethylene glycol (DEG) as a by-product from ethylene glycol may be suppressed by adding a small amount of a tertiary amine, such as triethylamine, tri-n-butylamine and benzyldimethylamine, a quaternary ammonium hydroxide, such as tetraethylammonium hydroxide, tetra-n-butylammonium hydroxide and trimethylbenzylammonium hydroxide, a basic compound, such as lithium carbonate, sodium carbonate, potassium carbonate and sodium acetate, or the like. The aforementioned nitrogen-containing heterocyclic compound has not only the effect of suppressing the formation of DEG, but also the effect of decreasing the terminal carboxyl group amount and the volume resistivity.

The esterification reaction product thus obtained is then transferred to the melt polycondensation step. The melt polycondensation may be performed under reduced pressure while distilling off the ethylene glycol thus formed, by using a single melt polycondensation tank or a multi-stage reaction apparatus having plural melt polycondensation tanks connected in series, for example, containing a complete mixing reactor equipped with agitation blades for the first stage and horizontal plug-flow reactors equipped with agitation blades for the second and third stages.

In the case where a single polycondensation tank is used, the reaction conditions for the melt polycondensation may be generally a temperature of approximately from 250 to 290° C. at normal pressure, which is gradually decreased finally to an absolute pressure of generally approximately from 1.3 to 0.013 kPa, under agitation for a reaction time of approximately from 1 to 20 hours. In the case where plural polycondensation tanks are used, the reaction in the first step polycondensation tank is generally performed at a temperature of from 250 to 290° C., and preferably from 260 to 280° C., and an absolute pressure of from 65 to 1.3 kPa, and preferably from 26 to 2 kPa, and the reaction in the final step polycondensation tank is generally performed at a temperature of from 265 to 300° C., and preferably from 270 to 295° C., and an absolute pressure of from 1.3 to 0.013 kPa, and preferably from 0.65 to 0.065 kPa. The reaction conditions in the intermediate step may be intermediate conditions between the conditions for the first step and the final step, and in a three-stage reactor, for example, the reaction in the second step polycondensation reaction tank is generally performed at a temperature of from 265 to 295° C., and preferably from 270 to 285° C., and an absolute pressure of from 6.5 to 0.13 kPa, and preferably from 4 to 0.26 kPa. Thus, the polyester resin may be produced. The polyester resin may be extruded in a molten state into strands from a die, solidified by cooling, and then cut with a cutter into particles (chips).

The polyester resin thus obtained may be used as a prepolymer and may be subjected to solid phase polycondensation. The solid phase polycondensation may be performed by a continuous system or a batch system, and a continuous system may be preferably employed from the standpoint of the operability. In this case, the prepolymer may be subjected to preliminary crystallization at a temperature lower than the temperature for performing the solid phase polycondensation, before the solid phase polycondensation. For example, the particles may be heated in a dry state to a temperature of from 120 to 200° C., and preferably from 130 to 190° C., for approximately from 1 minute to 4 hours, or may be heated in an atmosphere containing steam to a temperature of from 120 to 200° C. for 1 minute or more, and then subjected to the solid phase polycondensation.

Examples of the continuous solid phase polycondensation method include a method of performing solid phase polycondensation by heating to a temperature, the lower limit of which is generally 190° C., and preferably 195° C., and the upper limit of which is generally 230° C., and preferably 220° C., at increased pressure of generally 100 kPa or less, and preferably 20 kPa or less, in terms of relative pressure with respect to the atmospheric pressure, or at normal pressure, in an inert gas atmosphere of nitrogen, carbon dioxide, argon or the like, for generally approximately from 5 to 30 hours. The polycondensation temperature may be controlled within the aforementioned range in consideration of the terminal carboxyl group amount and the intrinsic viscosity described later.

The reaction time for the solid phase polycondensation may be selected from a range of from 1 to 50 hours to make an intrinsic viscosity of the polyester resin exceeding 0.70 dL/g, while the reaction time may vary depending on the reaction temperature.

The batch solid polycondensation method may also be employed. In this case, the target polyester resin may be obtained by heating to a temperature, the lower limit of which is generally 190° C., and preferably 195° C., and the upper limit of which is generally 230° C., and preferably 225° C., at reduced pressure, the lower limit of which is generally 0.013 kPa, and preferably 0.065 kPa, and the upper limit of which is generally 6.5 kPa, in terms of absolute pressure, for generally approximately from 1 to 25 hours, and preferably approximately from 1 to 20 hours.

The prepolymer obtained in the melt polycondensation step may be subjected to the solid phase polycondensation, thereby controlling the intrinsic viscosity to the prescribed range and decreasing the amount of the terminal carboxyl groups. For controlling the amount of the terminal carboxyl groups to the prescribed range after the solid phase polycondensation, it is preferred to control the terminal carboxyl group amount of the prepolymer to 25 eq/ton of resin or less, more preferably 20 eq/ton of resin. Examples of the method for achieving the terminal carboxyl group amount in this range include a method of adding an aliphatic diol, such as ethylene glycol, in the later stage of the esterification step, and the method of controlling the melt polycondensation temperature.

Among the methods, the method of adding an aliphatic diol is preferred since the terminal carboxyl group amount may be conveniently controlled, and the effect of the addition to the polycondensation reaction may be small. The amount of the aliphatic diol added in the esterification step is preferably from 50 to 1,200 mol/ton based on the prepolymer thus formed. When the aliphatic diol is added in a large amount exceeding the upper limit, it is not preferred since the load on the distillation system in the polycondensation reaction may be increased. The amount of the aliphatic diol added is more preferably from 100 to 1,000 mol/ton. The aliphatic diol added is most preferably ethylene glycol.

The timing of the addition of the aliphatic diol may be the later stage of the esterification step, and is preferably the point of time, at which the esterification rate (i.e., the oligomer reaction rate) exceeds 50%, more preferably 60%, further preferably 80%, and particularly preferably 90%. This is because the addition of the aliphatic diol to the oligomer having an esterification rate of less than 50% may be less effective for controlling the terminal carboxyl group amount.

In the polyester resin, inert particles having an average particle diameter of from 0.05 to 5.0 μm may be added as a lubricant at an arbitrary point of time for providing a polyester resin that is suitable for a film. The inert particles may be an inorganic material or an organic material. Examples of the inorganic particles include calcium carbonate, barium sulfate, alumina, silica, talc, titania, kaolin, mica and zeolite, and also include these materials having been surface-treated with a silane coupling agent, a titanate coupling agent or the like. Examples of the organic particles include an acrylic resin, a styrene resin and a crosslinked resin. The particle diameter of the lubricant is preferably in a range of from 0.05 to 5.0 μm in terms of average particle diameter. The lubricant may be added in an amount, the lower limit of which is generally 0.001% by weight, and preferably 0.05% by weight, and the upper limit of which is generally 2.0% by weight, preferably 1.0% by weight, and more preferably 0.4% by weight, based on the polyester resin.

The production method of the film, particularly the biaxially stretched film, using the polyester resin may be any known method, and examples thereof include a sequential biaxially stretching method, in which the polyester resin is melt-extruded into a film or sheet, which is then quenched with a cooling drum to form an unstretched film or sheet, and the unstretched film or sheet is preheated, stretched in the machine direction and then stretched in the transversal direction, and a simultaneous biaxially stretching method, in which the unstretched film or sheet is stretched in the machine and transversal directions simultaneously. The stretching ratio may be generally from 2 to 6 times in both the machine and transversal directions. The film after subjecting the biaxially stretching may be subjected to thermal setting and/or thermal relaxation. The thickness of the biaxially stretched film is generally approximately from 1 to 300 μm.

In the formation of the film, additives that are ordinarily used in a polyester resin may be added depending on necessity, examples of which include an antioxidant, an ultraviolet ray absorbent, a light stabilizer, an antistatic agent, a lubricant, an anti-blocking agent, an anti-fogging agent, a nucleating agent, a plasticizer and a colorant.

In the formation of the film, a particle master batch containing the aforementioned lubricant containing inorganic or organic particles may be added.

Characteristics of Biaxially Stretched Polyester Film for Protecting Back Surface of Solar Cell The biaxially stretched polyester film for protecting a back surface of a solar cell of the invention has a volume resistivity of the film at 285° C. that satisfies the following condition (1), preferably satisfies the following condition (1'), and more preferably is 1×10$^7$ Ω·cm or less:

$$\text{volume resistivity of the film at 285° C.} \leq 10 \times 10^7 \, \Omega\cdot\text{cm} \quad (1)$$

$$\text{volume resistivity of the film at 285° C.} \leq 5 \times 10^7 \, \Omega\cdot\text{cm} \quad (1')$$

The biaxially stretched polyester film for protecting a back surface of a solar cell of the invention preferably has an acid value (AV) that satisfies the following condition (2), more preferably satisfies the following condition (2'), and further preferably is 5 eq/ton or less:

$$\text{AV of the film} \leq 15 \, \text{eq/ton} \quad (2)$$

$$\text{AV of the film} \leq 10 \, \text{eq/ton} \quad (2')$$

The biaxially stretched polyester film for protecting a back surface of a solar cell of the invention preferably has an intrinsic viscosity (IV) that satisfies the following condition (3), more preferably is from 0.7 to 0.9 dL/g, and further preferably from 0.7 to 0.8 dL/g:

$$\text{IV of the film} > 0.7 \, \text{dL/g} \quad (3)$$

The IV of the film that is 0.9 dL/g or less may suppress the deterioration due to shear heating on extrusion molding (i.e., increase of AV). The IV of the film that exceeds 0.7 dL/g may maintain sufficient mechanical strength.

The biaxially stretched polyester film for protecting a back surface of a solar cell of the invention preferably has a content of diethylene glycol (DEG) of from 1.0 to 1.6% by mol, and more preferably from 1.1 to 1.3% by mol.

The content of DEG has an influence on the crystallization of the film. Specifically, the content of DEG that is 1.0% by mol or more may suppress increase of haze on forming the film due to increase in crystallization speed to assure good transparency. The content of DEG that is 1.6% by mol or less may suppress deterioration of the polymer property (heat resistance) due to copolymerization of DEG.

Purposes

The biaxially stretched polyester film for protecting a back surface of a solar cell of the invention may be applied to a back surface protective sheet for a solar cell (i.e., a so-called back sheet) in a solar cell having a laminated structure (transparent front substrate/device structure/back sheet) containing a transparent substrate disposed on the sunlight incident side (i.e., a front substrate, such as a glass substrate), a device structure (including a solar cell device and a sealant for sealing the cell), and the back sheet, which are laminated. The back sheet herein is a back surface protective sheet that is disposed on the side opposite to the side having the front substrate provided, with respect to the device structure of the cell base plate.

The biaxially stretched polyester film for protecting a back surface of a solar cell of the invention may be installed in a solar cell after laminating an additional functional layer thereto.

EXAMPLES

The invention will be described in more detail with reference to examples below.

The materials, the amounts used, the ratios, the contents of processes, the procedures of processes, and the like in the examples shown below may be appropriately changed unless they deviate from the substance of the invention. Accordingly, the scope of the invention is not construed as being limited to the specific examples shown below. The percentage and part are based on mass unless otherwise indicated.

Example 1

Esterification was performed roughly in two tanks (i.e., a first esterification reaction tank and a second esterification reaction tank), to which a Ti catalyst, a Mg compound, a P compound and an imidazble compound were added sequentially. Specifically, a Ti catalyst was added to a slurry tank of ethylene glycol and terephthalic acid or the first esterification reaction tank before the esterification reaction, and the Mg compound was added to the second zone of the second esterification reaction tank partitioned into three zones, whereas the P compound and the imidazole compound were added to the third zone of the second esterification reaction tank. In this example, a polyester resin was synthesized specifically in the following manner.

The polymerization equipment used in this example was a continuous polymerization equipment having one slurry preparation tank, two esterification reaction tanks (i.e., the first esterification reaction tank and the second esterification reaction tank) connected in series to the slurry preparation tank, and three polycondensation reaction tanks (i.e., first to third polycondensation reaction tanks) connected in series to the second esterification reaction tank.

Slurry Preparation Step 4.7 ton of high purity terephthalic acid (TPA) and 1.8 ton of ethylene glycol (EG) were placed in the slurry preparation tank and mixed for 90 minutes to prepare a slurry (raw material mixture).

Esterification Reaction Step

The slurry was continuously fed to the first esterification reaction tank at a flow rate of 3,800 kg/h.

An ethylene glycol solution of a citric acid chelated Ti complex was continuously fed to the first esterification reaction tank through an addition tube in such an amount that the content of titanium atoms in the resulting polyester resin was 8 ppm by weight, and reaction was performed under the following conditions. The citric acid chelated Ti complex used was Tyzor AC420, available from Dorf Ketal.

Conditions
Temperature in reaction tank: 250° C.
Average residence time: approximately 4.3 hours The reaction product obtained in the first esterification reaction tank was transferred to the second esterification reaction tank, and an ethylene glycol solution of magnesium acetate tetrahydrate was continuously added to the second zone of the second esterification reaction tank through an addition tube in such an amount that the content of magnesium atoms in the resulting polyester resin was 80 ppm by weight, and reaction was performed under the following conditions.

Conditions
Temperature in reaction tank: 250° C.
Average residence time: approximately 1.2 hours Subsequently, an ethylene glycol solution of trimethyl phosphate was continuously added to the third zone of the second esterification reaction tank in such an amount that the content of phosphorus atoms was 65 ppm by weight in the resulting polyester resin. Thereafter, an ethylene glycol solution of 2-ethyl-4-methylimidazole was continuously added through a separate addition tube in an amount of 1.0 mol/ton based on the resulting polyester resin, and reaction was performed under the following conditions.

Conditions:
Temperature in reaction tank: 250° C.
Average residence time: approximately 1.2 hours Polycondensation Reaction Step The esterification reaction product obtained in the esterification reaction step was continuously fed to the first polycondensation reaction tank, and polycondensation was performed under the following conditions.

Conditions:
Reaction temperature: 270° C.
Pressure in reaction tank: 2.67 kPa
Average residence time: approximately 1.8 hours Subsequently, the reaction product obtained in the first polycondensation reaction tank was transferred to the second polycondensation reaction tank, and polycondensation was performed under the following conditions.

Conditions:
Temperature in reaction tank: 270° C.
Pressure in reaction tank: 0.27 kPa
Average residence time: approximately 1.0 hours Subsequently, the reaction product obtained in the second polycondensation reaction tank was transferred to the third polycondensation reaction tank, and polycondensation was performed under the following conditions, thereby providing polyethylene terephthalate (PET).

Conditions:
Temperature in reaction tank: 272° C.
Pressure in reaction tank: 0.17 kPa
Average residence time: approximately 1.5 hours The resulting PET was ejected in a strand form into cold water and immediately cut to produce PET pellets (cross section: major diameter: ca. 4 mm, minor diameter: ca. 2 mm, length: ca. 3 mm).

For subjecting the resulting PET as a prepolymer to solid phase polycondensation, 5 g of chips of the PET pellets were arranged without overlap of the chips on an aluminum foil tray (bottom: 20 cm×10 cm, depth: 5.0 cm), and placed on a center of an inert oven having an inner temperature set to 40° C. The temperature was increased from 60° C. to 160° C. over 30 minutes, and drying and crystallization were performed at 160° C. for 2 hours, under a nitrogen stream of 50 L/min. Thereafter, the temperature was increased to 220° C. over 30 minutes, and solid phase polycondensation was performed at 220° C. for 20 hours.

Production of Master Pellets Containing Polyester and Terminal Blocking Agent

The PET pellets after the solid phase polycondensation and a terminal blocking agent that was selected as shown in Table 1 from the following terminal blocking agents were mixed to make a reactive terminal group amount in terms of equivalent to the terminal carboxyl group amount of the PET shown in Table 1, and the mixture was fed to a twin screw kneader for melt-kneading at 280° C., ejected in a strand form into water, and cut with a cutter to form chips. The chips were designated as master pellets.

Cyclic carbodiimide: the cyclic carbodiimide compound (2) described in paragraphs (0174) and (0175) of JP-A-2011-153209 (Mw: 516)

Composition of Master Pellets (Kind and Content of Metal Element Compound)

2.5 g of the master pellet specimen was completely decomposed through incineration by heating with hydrogen peroxide in the presence of sulfuric acid, and dissolved in distilled water to make 50 mL, which was quantitatively determined for the kinds and the contents of the metal element compounds with a plasma emission spectroscopic apparatus (ICP-AES, Model JY46P, available from Jobin Yvon), followed by converting to the amounts in terms of ppm by weight in the polyester resin.

Formation of Film

The master pellet specimen was melt-extruded at 290° C. and solidified by cooling on a cooling roll having a surface temperature set to 30° C. by an electrostatic adhesion method, thereby providing an unstretched sheet.

Stretching and Winding of Film

The unstretched sheet after surface treatment before stretching was stretched in the machine direction in 3.0 times at 100° C., then cooled to 25° C., and then stretched in the transversal direction in 3.7 times at 130° C. Thereafter, the film was thermally set at 220° C., relaxed in 2% in the transversal direction, and then wound. The resulting film was designated as the biaxially stretched polyester film of Example 1.

Evaluation of Process
Foreign Matters

The master pellets obtained after the polycondensation were dried and crystallized with a vacuum drier. One particle of the master pellets was placed on cover glass and melted on a hot plate heated to 290° C., and the molten material was observed for foreign matters therein with an optical microscope and evaluated by the following evaluation standard. The result is shown in Table 1.

Evaluation Standard
A: No formation of foreign matters was found.
B: Slight formation of foreign matters was found, but was practically allowable.
C: Notable formation of foreign matters was found.
D: Severe formation of foreign matters was found.

Odor

The odor in the film formation was sensorially evaluated for investigating the presence of odor. The result is shown in Table 1.

Measurement and Evaluation of Film

The specimen (polyester film) was measured and evaluated in the following manners.

Intrinsic Viscosity IV 0.5 g of the pulverized specimen was dissolved in a mixed solvent of phenol and tetrachloroethane (3/2 by weight) at 140° C. for 15 minutes to make a concentration (c) of 1.0 g/dL, and then measured for relative viscosity ($\eta$rel) to the original liquid at 25° C. with an Ubbelohde capillary viscometer, and the ratio ($\eta$sp/c) of the specific viscosity ($\eta$sp), which was obtained by (relative viscosity ($\eta$rel)-1), and the concentration (c) was obtained. The ratios ($\eta$sp/c) were obtained in the same manner for the cases of the concentrations (c) of 0.5 g/dL, 0.2 g/dL and 0.1 g/dL, and the ratio ($\eta$sp/c) where the concentration (c) was extrapolated to zero was obtained as the intrinsic viscosity ($\eta$) from the resulting values.

Terminal Carboxyl Group Amount (AV)

The specimen after pulverization was dried at 100° C. for 1 hour in a vacuum drier and cooled to room temperature in a desiccator. 0.1 g of the specimen thus dried was weighed precisely into a test tube, to which 5 mL of benzyl alcohol was added for dissolving the specimen at 195° C. while blowing dried nitrogen gas thereinto for 3 minutes, and then 5 mL of chloroform was added thereto, followed by cooling to room temperature. One or two droplets of a Phenol Red indicator was added to the resulting solution, which was titrated with a 0.01 N benzyl alcohol solution of potassium hydroxide under stirring with dried nitrogen gas blown thereinto. The end point of the titration was the point where the yellow color was changed to red. The same operation was performed without the use of the specimen for the control titration, and the terminal carboxyl group amount AV was calculated according to the following expression (3).

$$\text{Terminal carboxyl group amount AV (eq/ton of resin)}=(A-B)\times 0.1\times f/W \quad (3)$$

A: amount of 0.01 N benzyl alcohol solution of potassium hydroxide required for titration (µL)
B: amount of 0.01 N benzyl alcohol solution of potassium hydroxide required for control titration (µL)
W: amount of specimen (g)
f: titer of 0.01 N benzyl alcohol solution of potassium hydroxide titer (f)=((titer of 0.01 N hydrochloric acid aqueous solution)×(collected amount of 0.01 N hydrochloric acid aqueous solution (µL))/(amount for titration of 0.01 N benzyl alcohol solution of potassium hydroxide (µL))

The terminal carboxyl group amount AV thus calculated was evaluated by the following evaluation standard. The result is shown in Table 1.

Evaluation Standard
A: AV≤4 eq/ton
B: 4 eq/ton<AV≤8 eq/ton
C: 8 eq/ton<AV≤12 eq/ton
D: AV>12 eq/ton Volume Resistivity of Film $\rho V$ 23 g of a specimen of the biaxially stretched polyester film was placed in a branched test tube having an inner diameter of 20 mm and a length of 180 mm. After sufficiently replacing the interior of the tube with nitrogen, the test tube was immersed in an oil bath at 250° C., the interior of the tube was evacuated to 0.13 kPa with a vacuum pump for vacuum drying for 20 minutes, then the specimen was melted by increasing the temperature of the oil bath to 285° C., and then recovery of pressure with nitrogen and evacuation were repeated for removing bubbles mixed in the molten material. Two stainless steel electrodes each having an area of 1 cm$^2$ were inserted into the molten material in parallel to each other with a distance of 5 mm (the back surfaces of the electrodes, which did not face each other, were covered with an insulating material). After stabilizing the temperature, a direct current voltage of 100 V was applied to the electrodes with a resistance meter (Model HP4339B, available from Hewlett-Packard), and the resistance value was calculated and designated as the volume resistivity $\rho V$ ($\Omega \cdot$cm).

The volume resistivity $\rho V$ thus calculated was evaluated by the following evaluation standard. The result is shown in Table 1.

Evaluation Standard
A: $\rho V \leq 1.0 \times 10^7$ $\Omega \cdot$cm
B: $1.0 \times 10^7$ $\Omega \cdot$cm$<\rho V \leq 5 \times 10^7$ $\Omega \cdot$cm
C: $5 \times 10^7$ $\Omega \cdot$cm$<\rho V \leq 10 \times 10^7$ $\Omega \cdot$cm
D: $\rho V > 10 \times 10^7$ $\Omega \cdot$cm b Value The specimen of biaxially stretched polyester film was measured for the b value by a transmission method with a colorimeter (SE2000, available from Nippon Denshoku Industries, Co., Ltd.). The b value is a value that shows the extent of yellowness of the specimen, and a higher b value means progress of hydrolysis. The b value thus measured was evaluated by the following evaluation standard. The result is shown in Table 1.

Evaluation Standard
A: b value<5
B: 5≤b value<10
C: b value≥10

Content of Diethylene Glycol

The PET pellets were freeze-pulverized with liquid nitrogen, and 2 g of thereof was weighed. 50 mL of a 0.75 N NaOH methanol solution was added to the pulverized material thus weighed, and the pulverizedmaterial was dissolved (hydrolyzed) under refluxing over a hot water bath at 80° C., thereby providing a reaction solution. After neutralizing the reaction solution by adding terephthalic acid thereto, terephthalic acid was separated by filtration from the reaction solution, and the filtrate was measured for the content of diethylene glycol (DEG) by gas chromatography (GC). The DEG content thus measured was evaluated by the following evaluation standard. The result is shown in Table 1.

Evaluation Standard
A: 1.0% by mol≤DEG content<1.3% by mol
B: 1.3% by mol≤DEG content<1.6% by mol
C: DEG content≥1.6% by mol Examples 2 to 7 and Comparative Examples 1 and 2

Biaxially stretched polyester films of Examples and Comparative Examples were produced in the same manner as in Example 1 except that the materials and the production conditions in Example 1 were changed as shown in Table 1. Carzodilite LA-1 (acyclic polycarbodiimide, available from Nishinbo Chemical, Inc.)

Comparative Example 3

A biaxially stretched polyester film was produced in the same manner as in Example 1 except that a glycol solution of trimethyl phosphate was fed to the first esterification reaction tank in such an amount that the content of phosphorus atoms in the resulting polyester resin was 65 ppm by weight instead of the ethylene glycol solution of citric acid chelated Ti complex fed thereto, an ethylene glycol solution of a citric acid chelated Ti complex was fed to the esterification reaction product in the third zone of the second esterification reaction tank in such an amount that the content of titanium atoms in the resulting polyester resin was 8 ppm by weight instead of the ethylene glycol solution of trimethyl phosphate fed thereto, and the materials and the conditions were changed as shown in Table 1.

Comparative Example 4

A biaxially stretched polyester film was produced in the same manner as in Comparative Example 3 except that tetra-n-butyl titanate was used instead of citric acid chelated Ti complex.

Examples 2 to 7 and Comparative Examples 1 to 4 were evaluated in the same manner as in Example 1. The results are shown in Table 1.

TABLE 1

| | Production of polyester film | | | | | | | | | | |
|---|---|---|---|---|---|---|---|---|---|---|---|
| | Polymerization condition of PET layer | | | | | | | | | | |
| | Ti | | Mg | | P | | Nitrogen-containing compound | | P/Mg molar ratio | Order of addition | Terminal blocking agent |
| | Kind | ppm | Kind | ppm | Kind | ppm | Kind | ppm | | | |
| Example 1 | citric acid chelated Ti complex | 8 | magnesium acetate | 80 | trimethyl phosphate | 65 | 2-ethyl-4-methylimidazole | 1.0 | 0.64 | Ti -> Mg -> P | cyclic carbodiimide |
| Example 2 | citric acid chelated Ti complex | 8 | magnesium acetate | 80 | trimethyl phosphate | 65 | 1-methylimidazole | 1.0 | 0.64 | Ti -> Mg -> P | cyclic carbodiimide |
| Comparative Example 1 | citric acid chelated Ti complex | 8 | magnesium acetate | 80 | trimethyl phosphate | 65 | — | | 0.64 | Ti -> Mg -> P | cyclic carbodiimide |
| Comparative Example 2 | citric acid chelated Ti complex | 8 | magnesium acetate | 80 | trimethyl phosphate | 65 | — | | 0.64 | Ti -> Mg -> P | — |
| Example 3 | citric acid chelated Ti complex | 8 | magnesium acetate | 80 | trimethyl phosphate | 65 | 1-methylimidazole | 1.0 | 0.64 | Ti -> Mg -> P | — |
| Example 4 | citric acid chelated Ti complex | 8 | magnesium acetate | 80 | trimethyl phosphate | 65 | 1-methylimidazole | 1.0 | 0.64 | Ti -> Mg -> P | acyclic carbodiimide |
| Example 5 | citric acid chelated Ti complex | 8 | magnesium acetate | 80 | trimethyl phosphate | 45 | 1-methylimidazole | 1.0 | 0.44 | Ti -> Mg -> P | — |
| Example 6 | citric acid chelated Ti complex | 8 | magnesium acetate | 80 | trimethyl phosphate | 65 | 1-methylimidazole | 1.0 | 0.93 | Ti -> Mg -> P | — |
| Comparative Example 3 | citric acid chelated Ti complex | 8 | magnesium acetate | 80 | trimethyl phosphate | 65 | 1-methylimidazole | 1.0 | 0.64 | Ti -> Mg -> P | — |
| Example 7 | tetra-n-butyl titanate | 8 | magnesium acetate | 80 | trimethyl phosphate | 65 | 1-methylimidazole | 1.0 | 0.64 | Ti -> Mg -> P | — |
| Comparative Example 4 | tetra-n-butyl titanate | 8 | magnesium acetate | 80 | trimethyl phosphate | 65 | 1-methylimidazole | 1.0 | 0.64 | P -> Mg -> Ti | — |

| | Evaluation of process | | Characteristics and evaluation of film | | | | |
|---|---|---|---|---|---|---|---|
| | Foreign matters | Odor | IV dL/g | AV eq/ton | Volume resistivity at 285° C. ($\Omega \cdot cm$) | b Value | DEG |
| Example 1 | B | none | 0.78 | A | C $8 \times 10^7$ | B | A |
| Example 2 | B | none | 0.78 | A | C $8 \times 10^7$ | B | A |
| Comparative Example 1 | B | none | 0.78 | B | D $11 \times 10^7$ | B | A |
| Comparative Example 2 | A | none | 0.78 | D | B $2.5 \times 10^7$ | A | A |
| Example 3 | A | none | 0.78 | C | B $1.5 \times 10^7$ | A | A |
| Example 4 | A | present | 0.78 | A | C $8 \times 10^7$ | A | A |
| Example 5 | A | none | 0.80 | C | A $0.5 \times 10^7$ | B | A |

TABLE 1-continued

| | | | | | | | |
|---|---|---|---|---|---|---|---|
| Example 6 | B | none | 0.76 | C | C 6 × 10⁷ | A | B |
| Comparative Example 3 | C | none | 0.78 | C | D 11 × 10⁷ | B | B |
| Example 7 | B | none | 0.76 | C | B 1.5 × 10⁷ | B | A |
| Comparative Example 4 | C | none | 0.78 | D | D 11 × 10⁷ | C | B |

As shown in Table 1, it was found that the polyester films of Examples 1 to 7 had a small terminal carboxyl group amount AV, and thus were improved in the hydrolysis resistance. The polyester films of Examples had a small volume resistivity ρV, and thus had excellent electrostatic adhesion property.

On the other hand, the polyester films of Comparative Examples 1, 3 and 4 having a volume resistivity ρV that exceeded 10×10⁷ Ω·cm were inferior in the electrostatic adhesion property.

The polyester film of Comparative Example 2 having no imidazole (i.e., no nitrogen-containing heterocyclic compound) added had a larger terminal carboxyl group amount AV than the polyester film of Example 3 produced in the same conditions except for the presence of imidazole, and thus was insufficient in the hydrolysis resistance. There was also such a tendency that the volume resistivity ρV was increased due to the absence of imidazole added.

It was understood from the comparison between Example 2 (carbodiimide added) and Example 3 (no carbodiimide added) that the use of carbodiimide as a reactive terminal blocking agent decreased the AV.

It was understood from the comparison between Example 5 (small P/Mg ratio) and Example 6 (large P/Mg ratio) that there was such a tendency that a small P/Mg ratio decreased the volume resistivity ρV and the DEG amount and suppressed the formation of foreign matters, but increased the b value, whereas there is such a tendency that a large P/Mg ratio decreased the b value, but increased the volume resistivity ρV and the DEG amount.

It was understood from the comparison between Example 3 and Comparative Example 3 that the volume resistivity ρV and the DEG amount were suppressed lower, and the formation of foreign matters was also suppressed with the order of addition of Ti, Mg and P, rather than the order of addition of P, Mg and Ti.

It was understood from the comparison between Example (citric acid chelated Ti complex added) and Example 7 (tetra-n-butyl titanate added) that the selection of citric acid chelated Ti complex as the Ti compound suppressed the formation of foreign matters and decreased the b value.

While the present invention has been described in detail and with reference to specific embodiments thereof, it will be apparent to one skilled in the art that various changes and modifications can be made therein without departing from the spirit and scope thereof.

The present disclosure relates to the subject matter contained in International Application No. PCT/JP2013/076179, filed on Sep. 27, 2013, and Japanese Patent Application No. 2012-213623 filed on Sep. 27, 2012, the contents of which are expressly incorporated herein by reference in their entirety. All the publications referred to in the present specification are also expressly incorporated herein by reference in their entirety.

The foregoing description of preferred embodiments of the invention has been presented for purposes of illustration and description, and is not intended to be exhaustive or to limit the invention to the precise form disclosed. The description was selected to best explain the principles of the invention and their practical application to enable others skilled in the art to best utilize the invention in various embodiments and various modifications as are suited to the particular use contemplated. It is intended that the scope of the invention not be limited by the specification, but be defined claims.

What is claimed is:

1. A biaxially stretched polyester film for protecting a back surface of a solar cell, containing a polyester resin that is polymerized with addition of a Ti catalyst, a Mg compound, a P compound and a nitrogen-containing heterocyclic compound, and satisfying the following condition (1):

$$\text{volume resistivity at } 285°\text{ C. } \rho V \leq 10 \times 10^7 \text{ } \Omega \cdot \text{cm} \quad (1)$$

wherein the terminal carboxylic group amount AV of the biaxially stretched polyester film for protecting a back surface of a solar cell is 8 eq/ton or less.

2. The biaxially stretched polyester film for protecting a back surface of a solar cell according to claim 1, wherein the nitrogen-containing heterocyclic compound is an imidazole compound.

3. The biaxially stretched polyester film for protecting a back surface of a solar cell according to claim 1, wherein the polyester resin satisfies the following condition (A):
(A) The P/Mg molar ratio satisfies $0.6 \leq P/Mg \leq 0.9$.

4. The biaxially stretched polyester film for protecting a back surface of a solar cell according to claim 1, which is formed by extrusion-molding a polyester resin composition containing the polyester resin and a reactive terminal blocking agent.

5. The biaxially stretched polyester film for protecting a back surface of a solar cell according to claim 4, wherein the reactive terminal blocking agent is a carbodiimide compound having a cyclic structure.

6. A method for producing a polyester resin, comprising in this order:
(i) adding a Ti catalyst to a polyester precursor containing a dicarboxylic acid component and a diol component,
(ii) adding a Mg compound to the polyester precursor, and
(iii) adding a P compound to the polyester precursor, and
further comprising adding a nitrogen-containing heterocyclic compound to the polyester precursor,
wherein the terminal carboxylic group amount AV of the polyester resin is 8 eq/ton or less.

7. The method for producing a polyester resin according to claim 6, wherein the Ti catalyst is an organic chelate Ti complex having citric acid as a ligand.

* * * * *